United States Patent [19]

Hoggatt et al.

[11] Patent Number: 5,142,117
[45] Date of Patent: Aug. 25, 1992

[54] PROXIMITY HEATER FOR AN ULTRASONIC BONDING TOOL

[75] Inventors: Mark C. Hoggatt, Mesa; Arun Narayanan, Phoenix, both of Ariz.

[73] Assignee: Motorola, Inc., Schaumburg, Ill.

[21] Appl. No.: 616,147

[22] Filed: Nov. 20, 1990

[51] Int. Cl.⁵ .................... B23K 20/10; H05B 1/00
[52] U.S. Cl. .................. 219/85.16; 219/85.12; 219/85.13; 219/236; 219/227; 228/110; 228/1.1; 156/73.1; 392/407
[58] Field of Search ............ 219/227, 236, 85.1, 219/85.12, 85.13, 85.16, 56.1, 237–239, 221, 228, 229, 85.11, 9.5, 10.57; 228/110, 1.1, 4.5, 6.2; 156/73.1, 73.4, 580.2, 73.3; 83/171; 392/407, 418; 606/27

[56] References Cited

U.S. PATENT DOCUMENTS

| 3,271,555 | 9/1966 | Hirshon et al. | 228/6.2 |
| 3,358,897 | 12/1967 | Christensen | 228/4.5 |
| 3,405,024 | 10/1968 | Attwood et al. | 228/110 |
| 3,641,304 | 2/1972 | Angelucci | 219/238 |
| 3,891,822 | 6/1975 | Laub et al. | 219/92 |
| 3,897,296 | 7/1975 | Waldrum | 156/499 |
| 4,315,128 | 2/1982 | Matcovich et al. | 219/230 |
| 4,529,115 | 7/1985 | Renshaw et al. | 228/1.1 |
| 4,653,362 | 3/1987 | Gerber | 83/171 |
| 4,821,944 | 4/1989 | Tsumura | 228/110 |

FOREIGN PATENT DOCUMENTS

| 651911 | 3/1979 | U.S.S.R. | 228/110 |
| 1363042 | 8/1974 | United Kingdom | 228/4.5 |

Primary Examiner—Bruce A. Reynolds
Assistant Examiner—John A. Jeffery
Attorney, Agent, or Firm—Joe E. Barbee

[57] ABSTRACT

A heating element is held in position by a rigid holder constructed to surround an ultrasonic bonding tool and is itself fastened in a fixed position relative to the bonding tool, such that the rigid holder and the heating element are held in close proximity to the bonding tool without physically contacting the bonding tool. This serves to heat the bonding tool, facilitating adequate bonding without overly heating the integrated circuit assembly and without interfering with the critical ultrasonic properties of the bonding tool and ultrasonic transducer horn.

8 Claims, 3 Drawing Sheets

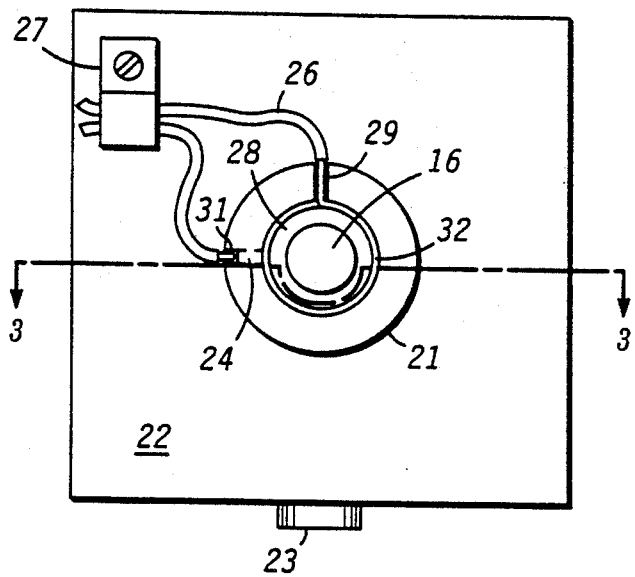
FIG. 2
FIG. 3
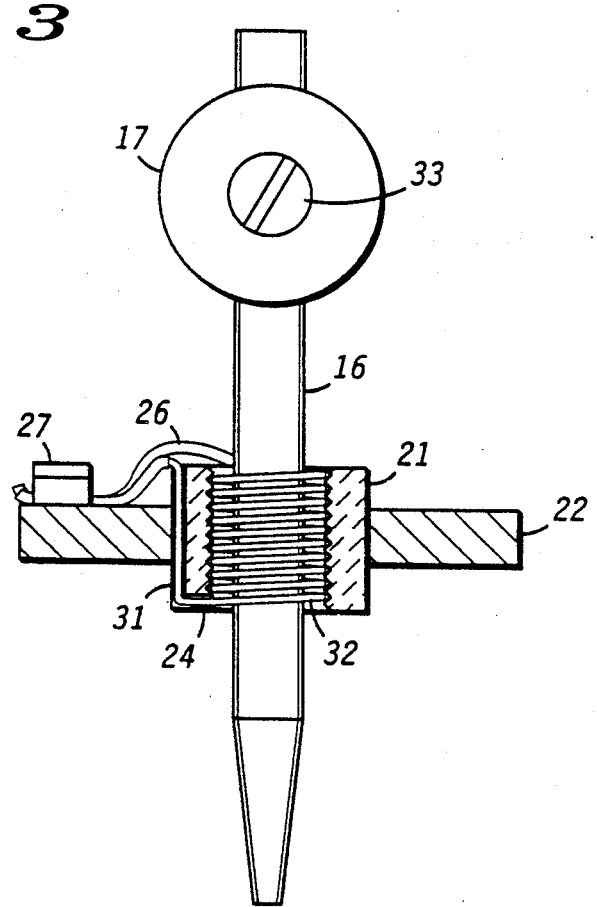

PROXIMITY HEATER FOR AN ULTRASONIC BONDING TOOL

BACKGROUND OF THE INVENTION

The present invention relates, in general, to an apparatus for improving the ultrasonic bonding of electrical connections to an electrical component, and more particularly, to a heated tool useful for tape automated bonding of integrated circuits.

Bonding of this type is typically accomplished by a combination of heat and ultrasonic energy applied to the bond site while a lead and associated pad are held together by means of a specially designed bonding tool.

In the past ultrasonic energy was applied through the bonding tool while the heat was applied by heating the pedestal which holds the electrical component in position. This method has the inherent disadvantage that the component must be heated to a higher temperature than the bond site. Components having several hundred electrical connections require large packages which act as effective heat sinks, so the component must be heated to an unacceptably high temperature in order to obtain an adequate temperature in the area being bonded.

A solution to this problem has been to heat the bonding tool itself either by means of a heater cartridge mounted inside the transducer horn assembly or by wrapping a heater directly around the bonding tool itself. These approaches have the disadvantage that they interfere with the finely tuned ultrasonic characteristics of the bonding tool and transducer horn assembly, thus compromising the efficiency of the ultrasonic energy transfer.

Accordingly, it would be desirable to overcome these deficiencies by heating the bonding tool without making physical contact to ultrasonically excited components.

SUMMARY OF THE INVENTION

The objectives and advantages of the present invention are provided by heating the bonding tool without physically contacting the bonding tool itself. A heating element is held in position by a rigid holder constructed to surround the bonding tool and is itself fastened in a fixed position relative to the bonding tool, such that the rigid holder and the heating element are held in close proximity to the bonding tool without physically contacting the bonding tool.

BRIEF DESCRIPTION OF THE DRAWINGS

FIG. 2 is a top view of a bonding tool with the proximity heater assembly in accordance with the present invention, FIG. 3 is a front section view of the bonding tool with the proximity heater assembly depicted in FIG. 2.

DETAILED DESCRIPTION OF THE DRAWINGS

Figure 1:
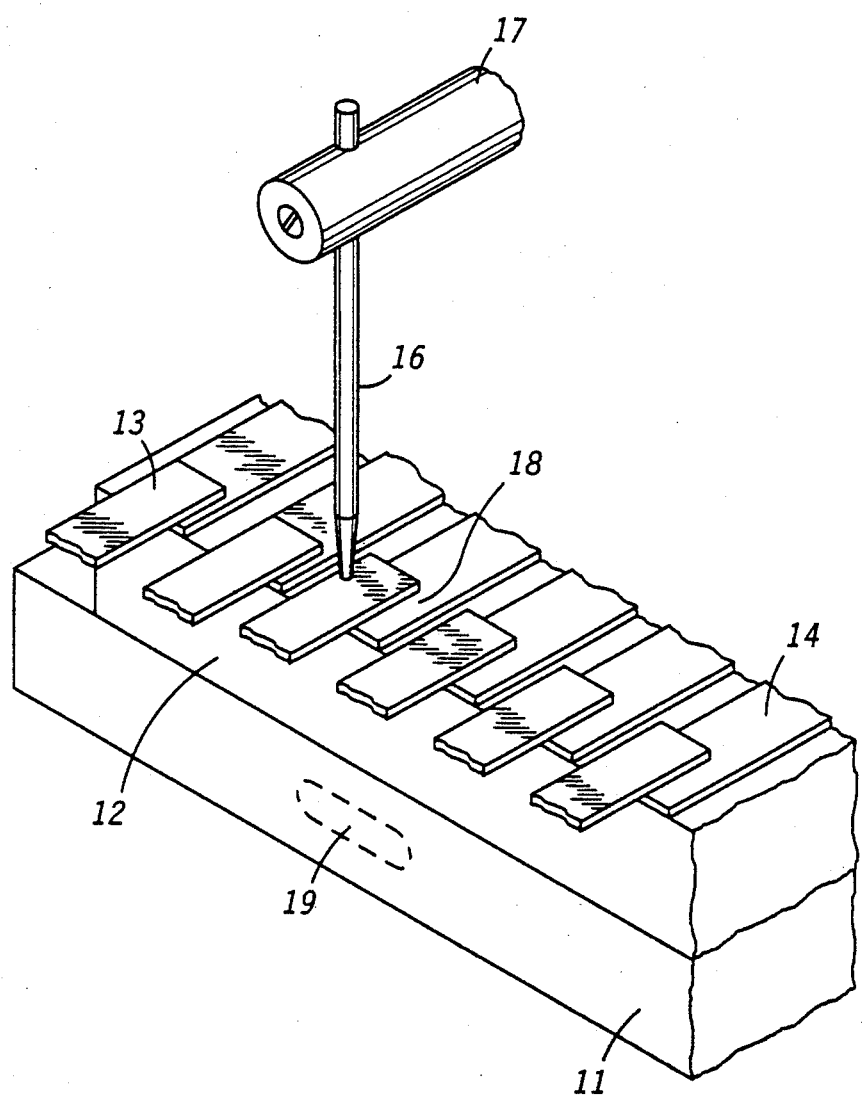
FIG. 1 is a schematic of a typical single point tape automated bonding machine in accordance with the prior art.

FIG. 1 is a diagrammatic view of a typical single point tape automated bonding machine of prior art. The machine consists of a pedestal 11 which holds an object containing bonding points such as an integrated circuit 12 in place so that the leads 13 may be bonded to the integrated circuit's bond pads 14. A bonding tool 16 is held in an ultrasonic transducer horn 17 and is used to bond the lead and bond pad together at a bond site 18.

Bonding takes place as a result of ultrasonic energy applied through bonding tool 16 and heat applied through integrated circuit 12 by means of a heater element 19 (shown in phantom) contained in pedestal 11.

Integrated circuit 12 and the associated package are heated only by pedestal 11, with the temperatures required varying depending upon such variables as package size and construction. In the case of large packages this approach typically requires a temperature of approximately 400 degrees Celsius at pedestal 11 to obtain a temperature of approximately 200 degrees Celsius which is required for satisfactory bonding at bond site 18. The resulting temperature within integrated circuit 12 is high enough to risk damage to it, while at the same time risking poor lead bonds due to low temperature at bond site 18. Larger integrated circuits with correspondingly larger packages will require even higher temperatures at pedestal 11 and further aggravate this problem.

Past approaches have heated bonding tool 16 by means of a heating element built into ultrasonic transducer horn 17 or by a coil of heating wire wrapped around bonding tool 16. Both approaches have the problem that they interfere with the ultrasonic properties of the assembly consisting of bonding tool 16 and transducer horn 17.

FIG. 2 depicts a top view of bonding tool 16 with a proximity heater assembly constructed in accordance with the present invention in place. The proximity heater assembly comprises a form holder 22 which holds a rigid form 21 firmly in position by means of a set screw 23. Rigid form 21 is preferably made from a high temperature machinable ceramic material, with a machine screw thread cut into a center hole 28. Wire guide slots 29, 31 and 24 are cut on the top, side, and bottom of rigid form 21 to serve as wire guides and hold a heating element 26 in place. A clamp 27 serves to hold heating element 26 in place on the holder and to relieve any wire motion external to the assembly.

In a preferred embodiment, heating element 26 is made from 0.043 centimeter diameter nichrome wire, although any heating element is suitable which can withstand the temperature required without melting and can also provide heating of approximately 355 watts per square centimeter inside hole 28.

Heating element or nichrome wire 26 is selected to have a resistivity appropriate for the temperature desired, and the portion that is outside center hole 28 is insulated by appropriate means such as Teflon (trademark) tubing or the like.

The portion of nichrome wire 26 which passes through center hole 28 is formed into a helical coil of bare wire 32, the helical coil being wound with a natural diameter slightly greater than that of center hole 28 and thus helical coil of bare wire 32 is held firmly in place by compression of the helical coil in grooves made in rigid form 21 around center hole 28.

Center hole 28 is made slightly larger than bonding tool 16; however, the clearance is kept as small as possible to allow maximum transfer of heat from helical coil 32 to bonding tool 16. In one preferred embodiment the helical groove is made by tapping center hole 28 with an American Standards Association, National Coarse machine screw thread number 6-32 which provides adequate clearance from bonding tool 16 without creating an excessive gap which would waste heat.

Figure 4:
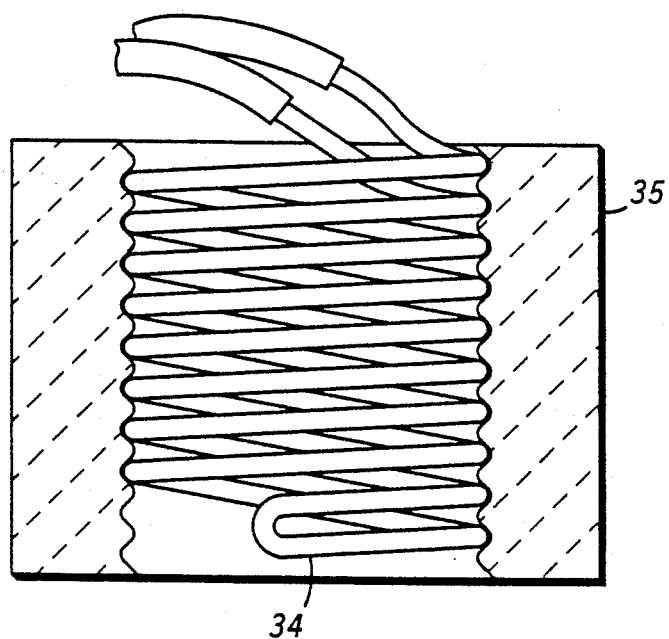
FIG. 4 is a front section view of part of FIG. 3 which illustrates two alternative embodiments of the present invention.

FIG. 4 is a front section view of part of FIG. 3 illustrating alternative embodiments which include the heating element being formed as an inductance cancelling helix 34 in a rigid holder 33 to minimize induced magnetic flux within bonding tool 16 (FIG. 3) from the heating element, and an embodiment with rigid holder 35 being molded with the heating element in place rather than being manufactured by a machining process. For conciseness two alternative embodiments are illustrated by FIG. 4 although either may be combined with the preferred embodiment illustrated in FIG. 3.

FIG. 3 depicts a side view of bonding tool 16 with a proximity heater assembly constructed in accordance with the present invention in place on a bonding machine (not shown). Part of form holder 22 and rigid holder 21 has been cut away for clarity. Bonding tool 16 is held in place by a set screw 33 on an ultrasonic transducer horn 17, which in turn is part of the bonding machine. This portion is unchanged from prior art.

Form holder 22 is fastened to the bonding machine by means of a bracket (not shown), which ensures an accurate, stable and permanent alignment between the proximity heater assembly and the bonding machine. The clearance between helical coil 32 and bonding tool 16 is adjusted so that a small gap exists between them even when bonding tool 16 is vibrating with ultrasonic energy. This adjustment is accomplished by loosening the mounting bolts between form holder 22 and the bracket holding it in place on the bonding machine which allows a small amount of movement of form holder 22.

By now it should be appreciated that there has been provided an improved means of heating an ultrasonic bonding tool without physically contacting the bonding tool, thereby not interfering with the operation of the bonding tool. This allows reliable bonds to be made to a semiconductor integrated circuit without applying excessive and potentially detrimental heat to the integrated circuit assembly itself.

We claim:

1. An ultrasonic bonding tool, said tool comprising an elongated bonding section having a working end and an ultrasonic transducer horn connected to an opposite end wherein the improvement comprises:
   a heating element;
   a rigid holder constructed to surround the bonding tool and to hold the heating element rigidly in position; and
   means to fasten the rigid holder in a fixed position relative to the bonding tool, such that the rigid holder and the heating element are held in close proximity to the bonding tool without physically contacting the bonding tool thereby locally heating a portion of the elongated bonding section of said tool adjacent said heating element.

2. The ultrasonic bonding tool according to claim 1 in which the heating element has a length of high resistivity heating wire such as nichrome, and the rigid holder is fabricated from a high temperature ceramic type material having an axial opening and is constructed such that the heating wire is held in a groove on the inside surface of the axial opening and wherein the groove is sized to hold the wire in place.

3. The ultrasonic bonding tool according to claim 2 in which the wire is formed as a coil within the rigid holder.

4. A proximity heating assembly including an ultrasonic bonding tool, said tool comprising an elongated bonding section having a working end and an ultrasonic transducer horn connected to an opposite end comprising:
   a heating element having a length of high resistivity heating wire such as nichrome;
   a rigid holder constructed to surround the bonding tool and to hold the heating element rigidly in position, the rigid holder being fabricated from a high temperature ceramic type material having an axial opening and constructed such that the heating wire is held in a groove on the inside surface of the axial opening and wherein the groove is sized to hold the wire in place and in which the wire is formed as an inductance cancelling helix in the rigid holder to minimize induced magnetic flux within the bonding tool from the heating element; and
   means to fasten the rigid holder in a fixed position relative to the bonding tool, such that the rigid holder and the heating element are held in close proximity to the bonding tool without physically contacting the bonding tool there locally heating a portion of the elongated bonding section of said tool adjacent said heating element.

5. The proximity heater according to claim 1 in which the rigid holder is fabricated from a high temperature ceramic type material having an axial opening and is constructed such that the heating element is molded within the ceramic type material on the inside surface of the axial opening.

6. A proximity heating assembly including an ultrasonic bonding tool, said ultrasonic bonding tool comprising an elongated bonding section having a working end and an opposite end to which an ultrasonic transducer horn is attached, said tool used in bonding leads to a semiconductor device, comprising said heating assembly has been inserted before "comprising":
   a helical coil of resistance wire;
   a rigid form of ceramic type material which rigidly supports the coil of resistance wire and allows the wire to be held in a precise alignment with the bonding tool; and
   means to fasten the rigid form of ceramic type material onto an ultrasonic bonding machine upon which the bonding tool is mounted in a fixed position relative to the bonding tool, such that the heating element and the rigid form of ceramic type material are held in close proximity to the bonding tool without physically contacting the bonding tool thereby locally heating a portion of the elongated bonding section of said tool adjacent said heating element.

7. A method of bonding a lead to a semiconductor device comprising:
   positioning the semiconductor device on a bonder;
   heating a bonding tool by passing electrical current through a heating element positioned around the bonding tool and held a predetermined distance from and in a fixed relationship to the bonding tool without making physical contact to the bonding tool;
   exciting the bonding tool by ultrasonic sound vibration; and bonding the lead to the semiconductor device by using the heated bonding tool.

8. A method according to claim 7 which in addition includes heating of a support pedestal which positions the semiconductor device.

* * * * *

UNITED STATES PATENT AND TRADEMARK OFFICE
CERTIFICATE OF CORRECTION

PATENT NO. : 5,142,117

DATED : August 25, 1992

INVENTOR(S) : Hoggatt et al.

It is certified that error appears in the above-indentified patent and that said Letters Patent is hereby corrected as shown below:

Column 4, claim 4, line 24, delete "there" and insert therefor --thereby--.

Column 4, claim 6, lines 37 and 38, delete "comprising said heating assembly has been inserted before "comprising":" and insert therefor --said heating assembly comprising:--.

Signed and Sealed this

Twenty-first Day of February, 1995

Attest:

BRUCE LEHMAN

*Attesting Officer*  *Commissioner of Patents and Trademarks*